United States Patent
Zilli et al.

(10) Patent No.: US 11,385,076 B2
(45) Date of Patent: Jul. 12, 2022

(54) SENSOR CIRCUIT AND METHOD FOR FILTERING A SENSOR SIGNAL

(71) Applicant: Infineon Technologies AG, Neubiberg (DE)

(72) Inventors: Massimiliano Zilli, Villach (AT); Mario Motz, Wernberg (AT)

(73) Assignee: Infineon Technologies AG

( * ) Notice: Subject to any disclaimer, the term of this patent is extended or adjusted under 35 U.S.C. 154(b) by 73 days.

(21) Appl. No.: 16/841,986

(22) Filed: Apr. 7, 2020

(65) Prior Publication Data
US 2020/0326208 A1   Oct. 15, 2020

(30) Foreign Application Priority Data
Apr. 15, 2019   (DE) .......................... 102019109892.0

(51) Int. Cl.
  *G01D 5/14*   (2006.01)

(52) U.S. Cl.
  CPC ................................... *G01D 5/145* (2013.01)

(58) Field of Classification Search
  CPC ..................................................... G01D 5/145
  See application file for complete search history.

(56) References Cited

U.S. PATENT DOCUMENTS

| | | | |
|---|---|---|---|
| 2006/0117834 A1* | 6/2006 | Goto ..................... | G01L 23/225 73/35.09 |
| 2008/0094055 A1 | 4/2008 | Monreal et al. | |
| 2016/0132091 A1* | 5/2016 | Bodner ..................... | G06F 1/06 713/323 |
| 2017/0347885 A1* | 12/2017 | Tan ..................... | A61B 5/02416 |

* cited by examiner

*Primary Examiner* — Clayton E. LaBalle
*Assistant Examiner* — Michael A Harrison
(74) *Attorney, Agent, or Firm* — Design IP (57) ABSTRACT

Sensor circuits having a filter and methods for filtering a sensor signal are provided. In this case, a passband width of an adjustable low-pass filter or bandpass filter is adjusted on the basis of a comparison of a measure of a signal change of a sensor signal with a threshold value.

25 Claims, 7 Drawing Sheets

SENSOR CIRCUIT AND METHOD FOR FILTERING A SENSOR SIGNAL

FIELD

The present application relates to sensor circuits having a low-pass filter or bandpass filter with an adjustable passband width and to corresponding methods.

BACKGROUND

Filters such as low-pass filters or bandpass filters are used in some applications in order to remove higher-frequency interference components, for example higher-frequency noise, from a useful signal. An example thereof are sensor circuits in which a signal generated by a sensor is converted into a digital signal by means of an analog/digital converter and this signal is then subjected to low-pass filtering or bandpass filtering in order to reduce higher-frequency noise. In this case, a comparatively low cut-off frequency of the low-pass filter or upper cut-off frequency of the bandpass filter is often desirable in order to suppress interference components, such as noise. On the other hand, a low cut-off frequency can result in dynamic changes in the input signal being reflected in the output signal from the filter with a relatively long delay, which may be undesirable for some applications, for example control systems in the automotive sector which are based on feedback signals from sensors.

SUMMARY

Sensor circuits as claimed in claim 1, 2, or 3 and a method as claimed in claim 17 are provided. The subclaims define further embodiments and a sensor system having such a low-pass filter.

One exemplary embodiment provides a sensor circuit having: a spinning Hall circuit with a Hall sensor element for generating a spinning Hall sensor signal; and a filter. The filter includes an input for receiving a signal based on the spinning Hall sensor signal, an adjustable low-pass filter or adjustable bandpass filter with an adjustable passband width, and a controller which is configured to adjust the passband width of the adjustable low-pass filter or bandpass filter on the basis of a comparison of a measure of a signal change of an input signal with a threshold value.

A further exemplary embodiment provides a sensor circuit having: a position sensor element and/or a movement sensor element for capturing a relative position or movement between a first element and a second element; and a filter. The filter includes an input for receiving a signal based on an output signal from the position sensor element and/or a movement sensor element, an adjustable low-pass filter or adjustable bandpass filter with an adjustable passband width, and a controller which is configured to adjust the passband width of the adjustable low-pass filter or bandpass filter on the basis of a comparison of a measure of a signal change of an input signal with a threshold value.

A further exemplary embodiment provides a sensor circuit having: a current sensor element and a filter. The filter includes an input for receiving a signal based on an output signal from the current sensor element, an adjustable low-pass filter or adjustable bandpass filter with an adjustable passband width, and a controller which is configured to adjust the passband width of the adjustable low-pass filter or bandpass filter on the basis of a comparison of a measure of a signal change of an input signal with a threshold value.

A further exemplary embodiment provides a method for filtering a spinning Hall sensor signal. The method includes adjusting a passband width of an adjustable low-pass filter or bandpass filter on the basis of a comparison of a measure of a signal change of a spinning Hall sensor signal with a threshold value, and filtering the spinning Hall sensor signal using the adjustable low-pass filter or bandpass filter.

The above summary provides only a brief overview of some exemplary embodiments and should not be interpreted as restrictive.

DETAILED DESCRIPTION

Different exemplary embodiments are explained in detail below. These exemplary embodiments are used merely for illustration and should not be interpreted as restrictive. For example, other exemplary embodiments may have features and components other than the explicitly described features and components. Features or components of different exemplary embodiments may be combined in order to form further exemplary embodiments. Variations and modifications which are described for one of the exemplary embodiments can also be applied to other exemplary embodiments and are therefore not explained several times.

Connections or couplings explained below are connections via couplings which can be used to transmit analog or digital signals, unless stated otherwise.

Exemplary embodiments relate to sensor circuits having a filter, which has an adjustable low-pass filter or bandpass filter, and to corresponding methods. Such filters are first of all explained with reference to FIGS. 1 to 6 before sensor circuits having such filters are then described.

Figure 1:
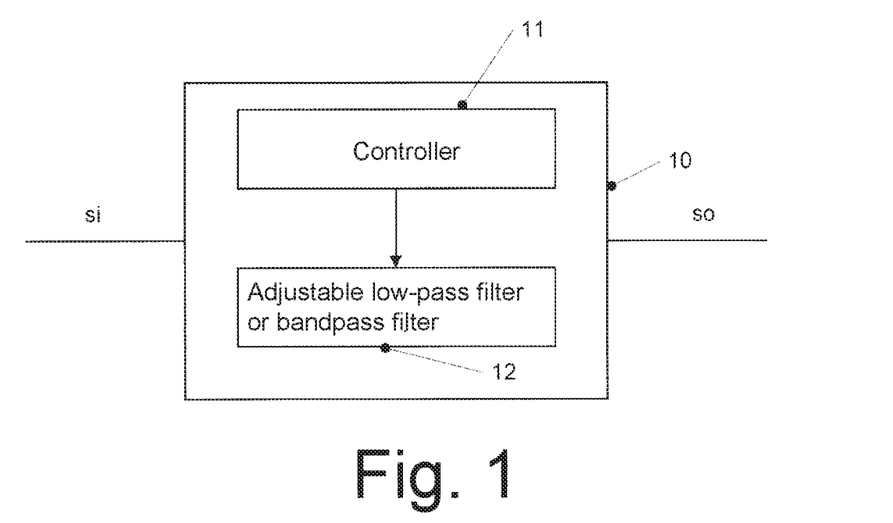
FIG. 1 is a block diagram of a digital low-pass filter according to one exemplary embodiment.

FIG. 1 shows a filter 10 according to one exemplary embodiment. The filter 10 receives an input signal si and outputs an output signal so as a filtered signal. The filter 10 may be a digital filter. In this case, the signals si, so are digital signals. Such a digital filter 10 can be implemented by means of any desired circuit components which enable digital signal processing. In this case, the filter 10 can therefore be implemented by means of an accordingly configured digital signal processor (DSP) or by means of specific hardware such as an application-specific integrated circuit (ASIC) or a field-programmable gate array (FPGA). An implementation by means of a multi-purpose processor (GPU, General Processing Unit) is also possible by means of appropriate programming. Combinations of the above possibilities can likewise be used. In other exemplary embodiments, the filter 10 may also be an analog filter which is implemented by means of corresponding analog components, for example by means of RC elements for providing a filter function.

The filter 10 has an adjustable low-pass filter or bandpass filter 12 with an adjustable passband width and a controller 11 for adjusting the passband width of the adjustable low-pass filter or bandpass filter 12. The passband width indicates the frequency range in which the adjustable low-pass filtering or bandpass filter 12 allows signals to pass. In the case of an adjustable low-pass filter, the passband width extends from 0 to a cut-off frequency fc. The cut-off frequency fc is that frequency which, when exceeded, causes a signal amplitude at the output of the adjustable low-pass filter 12 to fall to a predefined fraction of the input signal amplitude. The predefined fraction is usually set to $1/\sqrt{2}$. The cut-off frequency is also referred to as the transition frequency or base frequency. In the case of an adjustable bandpass filter, the passband width extends from a lower cut-off frequency to an upper cut-off frequency. In this respect, a low-pass filter can be considered to be a special case of a bandpass filter with a lower cut-off frequency of 0.

In order to simplify the following explanations, an adjustable low-pass filter is assumed in the remaining description of FIG. 1 and in the description of FIGS. 2 to 6. The explanations apply in a corresponding manner to an adjustable bandpass filter, in which case statements relating to the cut-off frequency fc of the adjustable low-pass filter and the adjustment of said frequency correspondingly apply to the upper cut-off frequency when using an adjustable bandpass filter. In addition, when using an adjustable bandpass filter, the lower cut-off frequency can likewise be adjusted, for example increased, if the upper cut-off frequency is reduced, in order to reduce the passband width "from both sides", and reduced if the upper cut-off frequency is increased, in order to increase the passband width "on both sides".

The controller 11 controls the cut-off frequency of the adjustable low-pass filter 12 on the basis of the input signal si. If a measure of signal changes of the input signal si is below a threshold value, the cut-off frequency is reduced, is set to a relatively low value or is kept at the low value. If the measure of the signal changes of the input signal si changes by more than the threshold value, the cut-off frequency is increased. If the change in the signal amplitude becomes smaller again than the threshold value (or a further threshold value), the cut-off frequency is reduced again. For example, it is possible to change over between two or more values of the cut-off frequency in this manner.

The measure of the signal change is in this case a variable which reflects signal changes of the input signal. For example, the signal changes themselves can be used as a measure by using, for example, the difference between successive samples of the input signal as the measure. In other exemplary embodiments, the measure can also be obtained from signals, for example filtered signals, derived from the input signal. An example of this is explained later with reference to FIG. 3.

The cut-off frequency of the adjustable low-pass filter 12 in this case determines the cut-off frequency of the filter 10, with the result that the latter changes on the basis of the input signal si.

Figure 2:
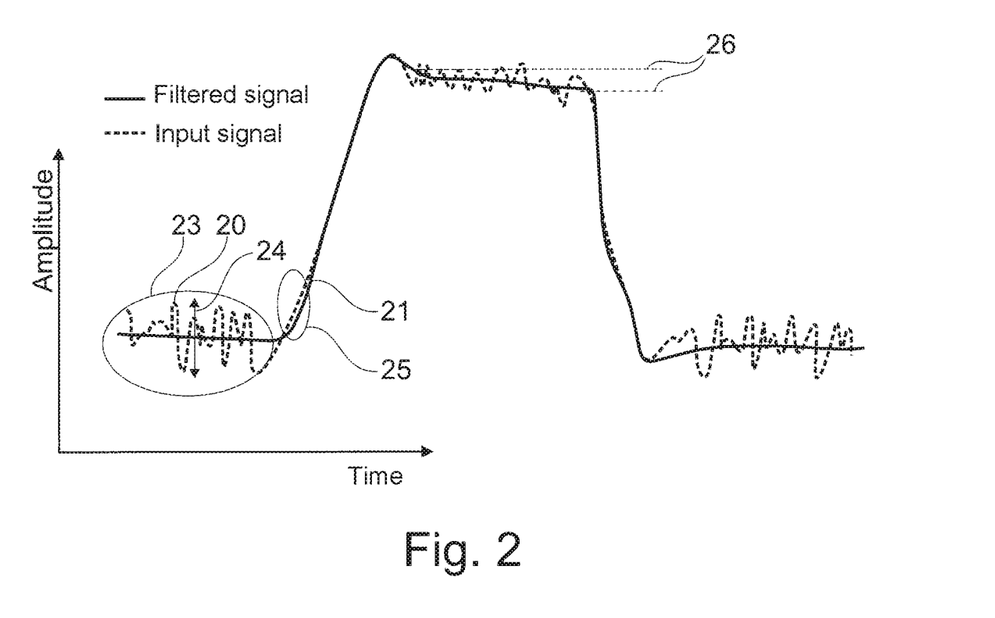
FIG. 2 shows exemplary signals for illustrating the method of operation of some exemplary embodiments.

This is now explained in more detail on the basis of exemplary signals with reference to FIG. 2.

In FIG. 2, a curve 20 shows an input signal of a digital low-pass filter according to one exemplary embodiment over time, for example the input signal si of the filter 10 in FIG. 1, and a curve 21 shows a corresponding filtered signal, for example the output signal so in FIG. 1. In a region 23, fluctuations of the input signal 20 are less, in terms of value, than a threshold value 24, indicated by means of an arrow in FIG. 2. In this case, the cut-off frequency of the adjustable low-pass filter 12 in FIG. 1, for example, is set to a relatively low value in order to filter out these fluctuations as far as possible, which fluctuations may be caused by different interfering influences such as thermal noise, 1/f noise and quantization noise.

In a region 25, the input signal 20 then changes by a value which is above the threshold value 24. Here, the cut-off frequency of the digital low-pass filter is now increased, for example by increasing the cut-off frequency of the adjustable low-pass filter 12 in FIG. 1. This results in the profile of the filtered signal 21 being able to follow the input signal 20 after adjustment of the cut-off frequency without a relatively long delay. In a region 26, the cut-off frequency can then be reduced again in some exemplary embodiments, since only slow changes of the input signal occur here, in order to be able to better filter out interference. At the end of the region 26, a change of the input signal 20 then exceeds the threshold value again, with the result that the cut-off frequency is increased, and the filtered signal 21 can thus follow the input signal 20 again with only a slight delay. This approach can then be continued in the further course of the input signal.

In this manner, in some exemplary embodiments, both efficient filtering of interference, in particular in phases in which there are no severe and rapid changes of the input signal, and tracking of the input signal by means of the filtered signal without a severe delay in the case of rapid signal changes are possible.

Figure 3:
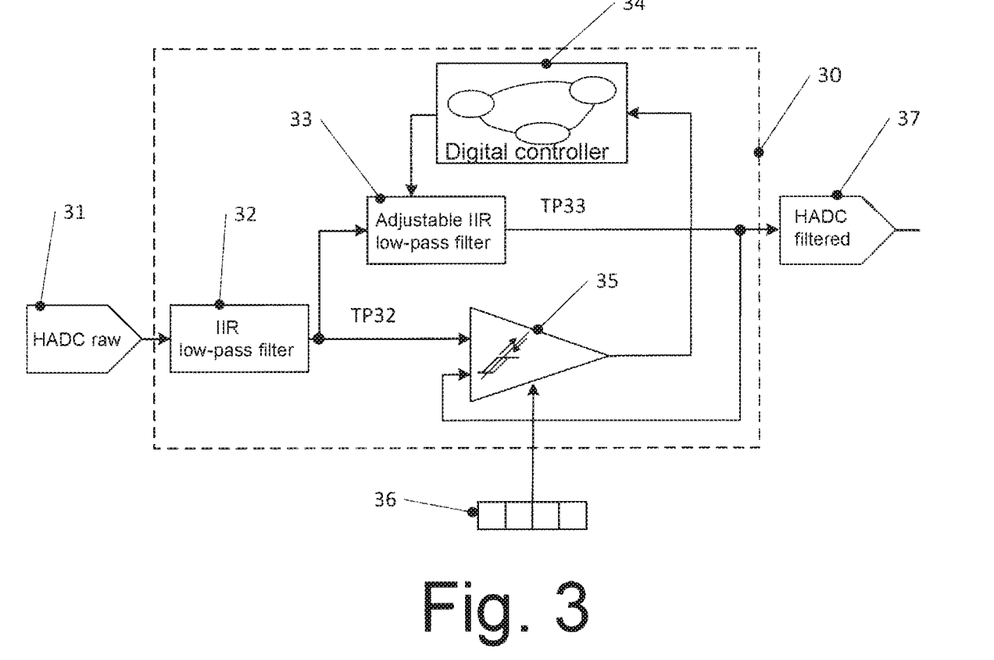
FIG. 3 shows a block diagram of a low-pass filter according to a further exemplary embodiment.

FIG. 3 shows a block diagram of a digital low-pass filter 30 according to a further exemplary embodiment. In order to avoid repetitions, reference is made to the previous explanations with respect to FIGS. 1 and 2 when describing the digital low-pass filter 30.

The digital low-pass filter 30 in FIG. 3 receives a digital signal HADC raw from an analog/digital converter at an input 31, for example, and outputs a low-pass-filtered signal HADC filtered at an output 37. With respect to the possible implementations of the digital low-pass filter 30, the explanations with respect to the filter 10 in FIG. 1 apply accordingly.

The digital low-pass filter 30 has a fixed low-pass filter 32 with an infinite impulse response (IIR), which is referred to as low-pass filter 32 for short below. The low-pass filter 32 has a fixed cut-off frequency which determines a maximum bandwidth of the digital low-pass filter 30. An adjustable IIR low-pass filter 33 is connected downstream of the low-pass filter 32 and has an adjustable cut-off frequency which is adjusted by a digital controller 34. The adjustable cut-off frequency of the low-pass filter 33 ranges from below the cut-off frequency of the low-pass filter 32, that is to say further restricts the frequency passband, to above the cut-off frequency of the low-pass, leaving the bandwidth of the low-pass filter 30 to be determined by the cut-off frequency of the low-pass filter 32. An output of the low-pass filter 33 is connected to the output 37 of the digital low-pass filter 30.

The digital low-pass filter 30 also comprises a digital comparator 35. An output signal TP32 from the low-pass filter 32 is supplied to a first input of the digital comparator 35, and an output signal TP33 from the low-pass filter 33 is supplied to a second input of the digital comparator 35. A threshold value which is stored in a register 36 as a digital value having a plurality of bits is also supplied to the digital comparator 35. This threshold value can be configured by a user in the exemplary embodiment in FIG. 3.

An output signal from the digital comparator 35 indicates whether or not an absolute value of the difference between the output signals from the low-pass filters 32, 33 is greater than the threshold value. In this case, the difference is used as a measure for signal analyses of the input signal. On the basis of this, the digital controller 34 increases or reduces the cut-off frequency of the adjustable low-pass filter 33. The digital controller 34 may be in the form of a state machine, for example, in which each state corresponds to a value of the cut-off frequency and it is possible to change between the states on the basis of the output from the digital comparator 35. A pseudocode of the digital controller 34 can read as follows, for example, for this:

```
if (abs (TP33–TP32)>hyst)
    increase (Fc)
else
    decrease (Fc)
```

According to this pseudocode, an if/else query is carried out. In this case, abs denotes the absolute value, TP33 denotes the output signal from the low-pass filter 33 and TP32 denotes the output signal from the low-pass filter 32. Hyst is the threshold value. If the absolute value of the difference between the output signals TP33 and TP32 (that is to say between respective samples of the output signals) is greater than the threshold value, the cut-off frequency Fc is increased (increase (Fc)) and is otherwise reduced (decrease (Fc)). In the case of the implementation as a state machine, the state machine can change to a state which is assigned to a higher cut-off frequency in order to increase the cut-off frequency Fc and can change to a state which is assigned to a lower cut-off frequency in the case of reducing the cut-off frequency. If a maximum or minimum cut-off frequency (for example a corresponding state) has been reached, the cut-off frequency is not increased or reduced any further, but rather the corresponding maximum or minimum value is held. In some exemplary embodiments, only two values are also used for the cut-off frequency Fc and are set to the higher cut-off frequency in the case of increase (Fc) and are set to the lower cut-off frequency in the case of decrease (Fc) or are held at said frequency.

In other exemplary embodiments, two threshold values can also be used. If the absolute value of the difference TP33-TP32 is greater than a first threshold value, the cut-off frequency Fe is increased and, if it is less than a second threshold value which is less than the first threshold value, the cut-off frequency is reduced. The wording that the cut-off frequency is changed on the basis of a threshold value also comprises such scenarios. This can be achieved by implementing the digital comparator 35 as a window comparator with the first and second threshold values. In some exemplary embodiments, this makes it possible to prevent rapid switching back and forth of the cut-off frequency if the measure of the signal change is close to the threshold value over a relatively long time, for example. Alternatively, or additionally, the digital comparator 35 or the digital controller 34 can be configured in such a manner that, following a change to the cut-off frequency, a next change to the cut-off frequency can be effected at the earliest after a predefined period of time.

Figure 4A:
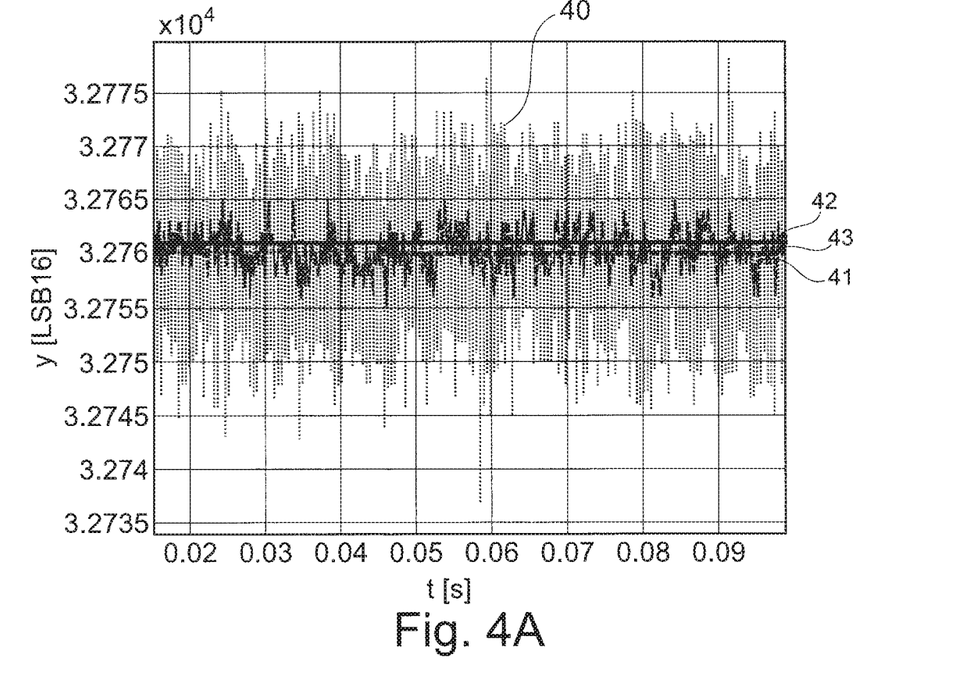
FIGS. 4A and 4B show simulations for illustrating the method of operation of some exemplary embodiments.
Figure 4B:
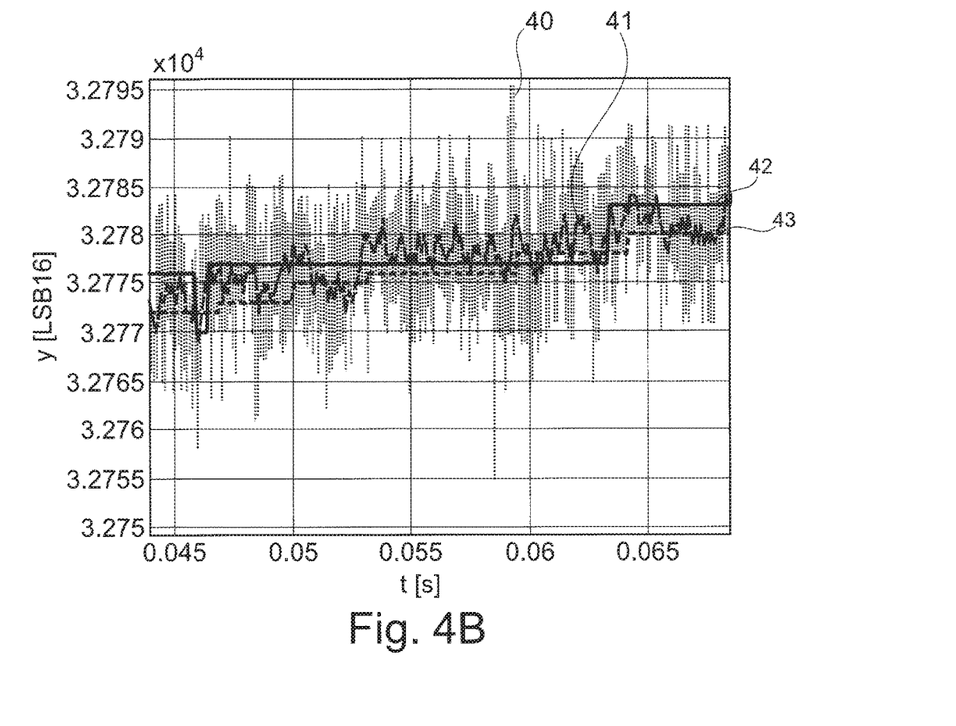

The method of operation of the digital low-pass filter 30 is explained further on the basis of simulation examples illustrated in FIGS. 4A and 4B. The signals shown are used only for illustration.

In the simulation examples, a digital low-pass filter, as shown in FIG. 3, is compared with a conventional solution in which an output signal from a filter is easily increased if a signal change exceeds a threshold value. As a further comparison example, a conventional filter with a fixed cut-off frequency is used.

FIG. 4A shows a situation with an input signal 40 which is constant overall but is noisy. In this case, the input signal 40 comes from a measurement by means of a sensor, that is to say is a real signal. The behavior of the various filters was then determined by means of a simulation.

A curve 41 shows an application of a low-pass filter with a fixed cut-off frequency of 500 MHz. A curve 42 shows an output signal from a filter which increases the output signal if a signal change exceeds a threshold value and otherwise keeps the signal constant. A curve 43 shows the application of the digital filter 30 in FIG. 3 to the input signal 40. In this case, the curves 42 and 43 show a substantially similar behavior, apart from a change in the signal output in the case of the curve 43.

FIG. 4B shows the same curves 40 to 43 for a situation in which the input signal according to the curve 40 increases overall, but is still noisy. It is clear here that the digital filter 30 follows the signal profile more closely according to the curve 43, while the curve 42 has greater jumps and therefore a lower degree of accuracy. In contrast, in the solution with a fixed cut-off frequency according to the curve 41, a noisier signal results. In some exemplary embodiments, it is therefore possible to provide more precise tracking of the signal profile with good noise suppression at the same time.

In the exemplary embodiment in FIG. 3, the threshold value can be predefined by means of appropriate programming of the register 36. In an extension, a suitable threshold value can also be automatically set. A corresponding exemplary embodiment of a digital low-pass filter 50 is illustrated in FIG. 5.

Figure 5:
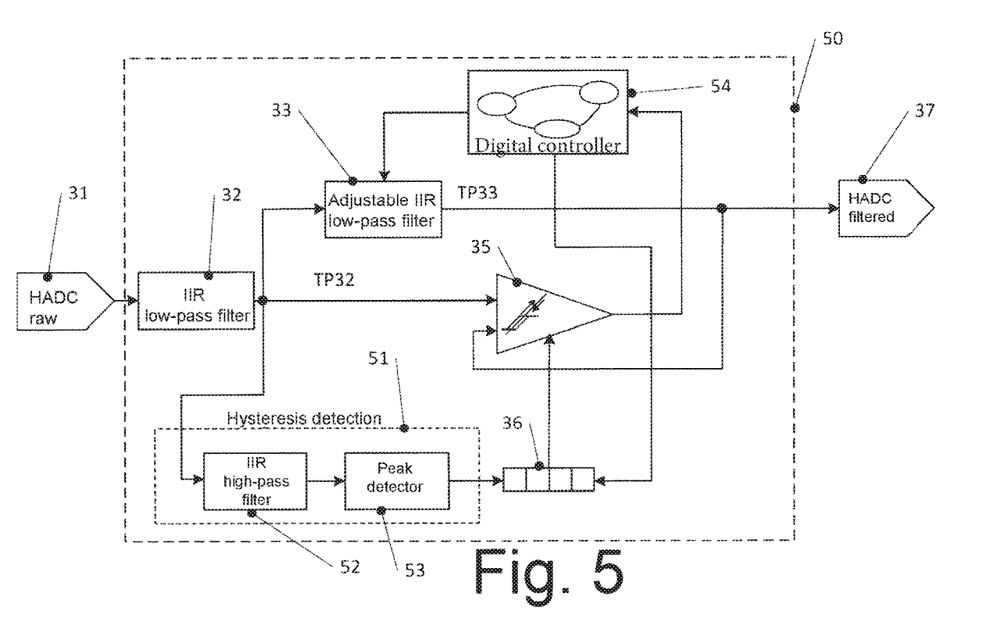
FIG. 5 shows a block diagram of a low-pass filter according to a further exemplary embodiment.

In this case, components of the exemplary embodiment in FIG. 5 which correspond to those of the exemplary embodiment in FIG. 3 have the same reference signs and are not explained in detail again.

In addition to the components of the digital low-pass filter 30 in FIG. 3, the digital low-pass filter 50 has hysteresis detection 51 comprising a high-pass filter 52 with an infinite impulse response and a peak detector 53. A cut-off frequency of the high-pass filter 52 is set to a minimum cut-off frequency of the low-pass filter 33. The digital controller 54 carries out the functions described for the digital controller 34 in FIG. 3 and additionally enables writing to the register 36 if the cut-off frequency of the low-pass filter 33 is set to a lowest possible value.

In this case, the high-pass filter 52 therefore operates in a complementary manner to the low-pass filter 33 and allows substantially only a noise component of the output signal TP32 from the low-pass filter 32 to pass through. The peak detector 43 then detects a maximum of the absolute value of this noise, and a corresponding value is written to the register 36 as a threshold value. Since, according to the control already explained, the dynamic low-pass filter 33 is set to a minimum cut-off frequency when variations in the input signal are small and, in particular, are below the threshold value, this ensures that the threshold value is determined in a substantially steady state (for example the region 23 in FIG. 2) in which changes in the input signal, apart from noise, are at least very minor and, as a result, only the noise is actually determined by the high-pass filter 52.

A pseudocode for the digital controller 54 may be as follows.

```
if (abs (TP33−TP32)>hyst)
    increase (Fc)
else
    decrease (Fc)
if (is_minimum (Fc))
    Hyst_reg= Peak_detector
```

The first part corresponds to the pseudocode (already discussed) of the controller 34 in FIG. 3. The second if query queries whether the cut-off frequency Fc of the low-pass filter 33 is at its minimum value and writes the output value from the peak detector 53 Peak_detector to the register 36 (Hyst_reg).

In the case of such an exemplary embodiment, the threshold value need not be externally set, with the result that there is no need for any detailed analysis of the noise. In addition, the digital low-pass filter can independently adapt to changed noise conditions.

Figure 6:
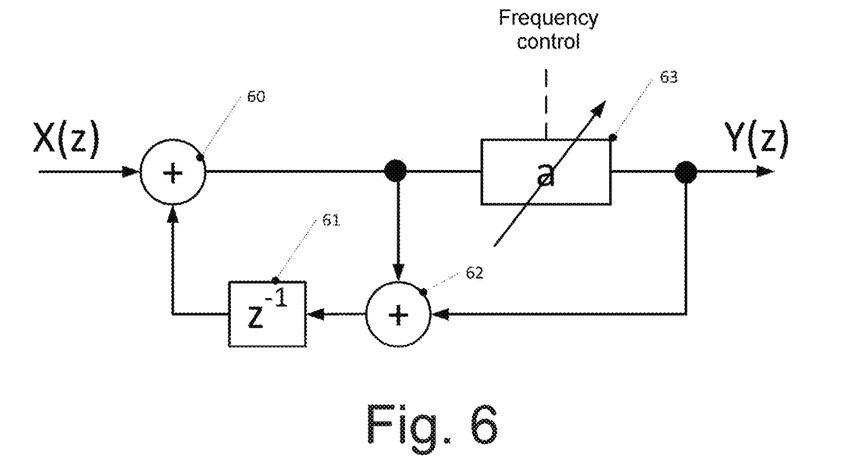
FIG. 6 shows a block diagram of an adjustable low-pass filter, as can be used in some exemplary embodiments.

The filters 32 and 52 used can be implemented in any desired conventional manner. The same fundamentally applies to the adjustable low-pass filter 33 in which only one parameter which determines the cut-off frequency is variable. An example of an implementation of an adjustable low-pass filter with an infinite impulse response is illustrated in FIG. 6. As often in the case of digital filters, the illustration is effected here on the basis of the z-transform of the signals.

In FIG. 6, the input signal of the filter is denoted by X(z) and the output signal is referred to as Y(z). The input signal X(z) is supplied to a first input of an adder 60. An output signal from the adder 60 is supplied to a first input of an adder 62 and to a multiplier 63. The signal is multiplied by an adjustable value a in the multiplier 63. The cut-off frequency of the digital low-pass filter is changed by changing the value a. An output signal from the multiplier 63 is output as the output signal Y(z) and is fed back to a second input of the adder 62. An output signal from the adder 62 is delayed by a time unit in a delay element 61 (expressed by z-1), and the signal delayed in this manner is supplied to a second input of the adder 60. Other structures for implementing a low-pass filter with an adjustable cut-off frequency, in particular a higher-order low-pass filter, are also possible.

Low-pass filters, as explained above, can be used, for example, in the processing of sensor signals. A corresponding sensor circuit is illustrated in FIG. 7.

Figure 7:
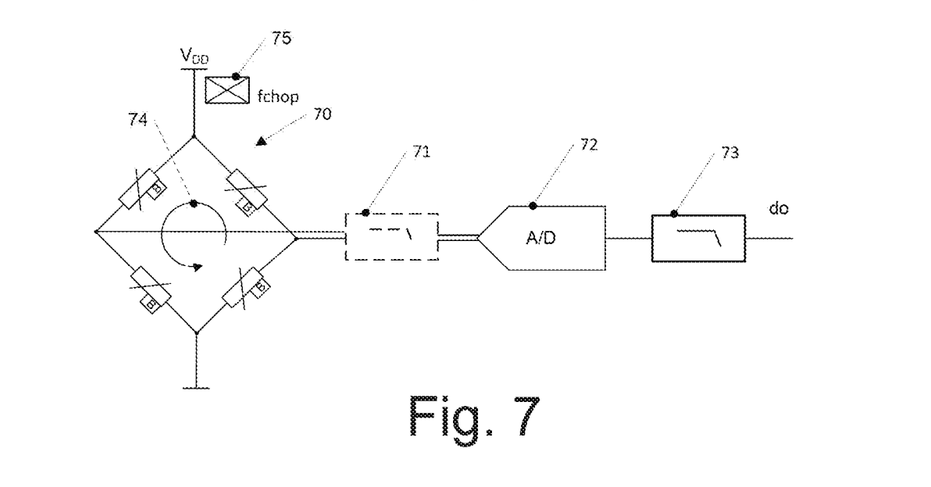
FIG. 7 shows a block diagram of a sensor circuit according to one exemplary embodiment.

The system in FIG. 7 has a sensor 70. In the example illustrated, the sensor 70 is a magnetic field sensor implemented as a bridge circuit with four magnetoresistive elements. As indicated by an arrow 74, the sensor 70 is operated in this case using a spinning current technique in which the connections for applying a bias voltage and for tapping off the sensor signal are "shuffled" as it were, which can reduce an offset. It is also possible to carry out chopping, as indicated by a chopper 75 with a chopper frequency fchop. In this case, the bias voltage is applied in a pulsed manner as it were at fchop, and the evaluation is carried out accordingly. In this case, the chopping can be carried out in sync with the spinning current technique. However, this is only one example, and it is also possible to use other sensors, as described later with reference to FIGS. 9 and 10. An output signal from the sensor 70 is digitized in an analog/digital converter 72. An analog low-pass filter 71 can be optionally connected as an anti-aliasing filter between the sensor 70 and the analog/digital converter 72 in order to avoid signal convolution. For this purpose, the analog low-pass filter 71 is used to filter out frequencies which are higher than half the sampling rate of the analog/digital converter 72.

A digital low-pass filter 73 which is configured as described above and has an adjustable cut-off frequency is connected downstream of the analog/digital converter 72. As explained, a bandpass filter can also be used instead of a low-pass filter. The digital low-pass filter 73 may therefore be the filter 10 in FIG. 1, the digital low-pass filter 30 in FIG. 3 or the digital low-pass filter 50 in FIG. 5. The digital low-pass filter 73 is used to filter out noise components of the signal which can result from different sources, such as the sensor 70 or the analog/digital converter 72. In this case, as explained, an output signal do from the digital low-pass filter 73 can follow the signal profile with a comparatively shorter delay in the case of rapid changes in the signal output by the sensor 70.

The digital low-pass filter 73 can be integrated, together with the analog/digital converter 72 and possibly also together with the filter 71 and the sensor 70 (depending on the type of sensor 70), on a chip. In this case, the adjustability of the digital low-pass filter 73 has only a slightly higher area consumption than conventional filter solutions in some implementations. The use of the filter 73 makes it possible, in some implementations, to avoid subsequent processing of the signal for noise removal, for example by means of a downstream microcontroller, which avoids additional delays caused by such post-processing. The accuracy and resolution of the signal originally output by the sensor can be substantially retained in some exemplary embodiments, in addition, good noise suppression can be ensured.

Figure 8A:
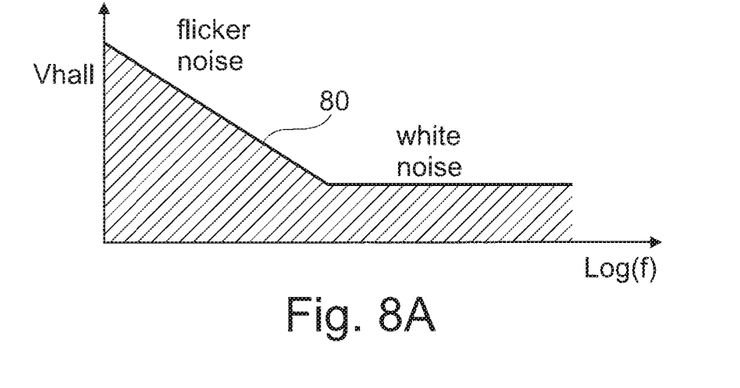
FIGS. 8A to 8C show graphs for illustrating the method of operation of the sensor circuit from FIG. 7.
Figure 8B:
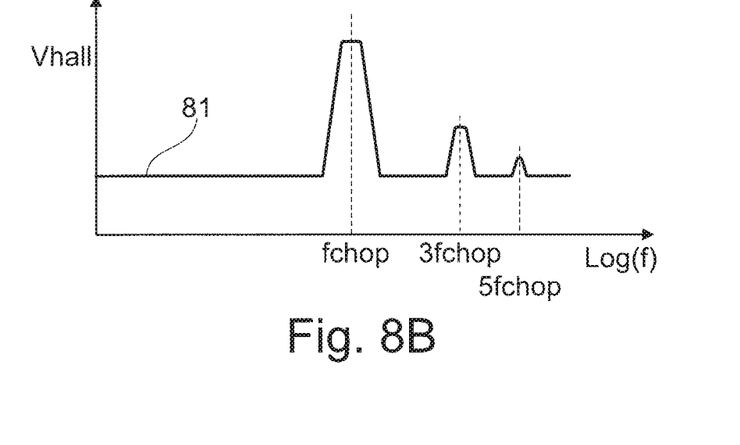
Figure 8C:
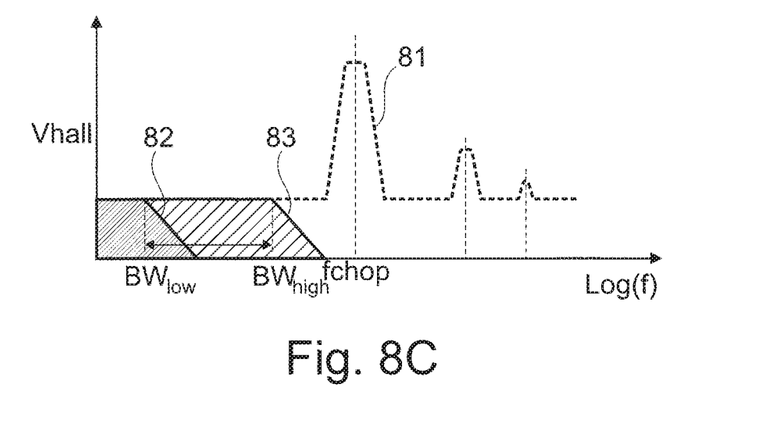

The suppression of noise when using the spinning current technique and chopping by means of the digital low-pass filter 73 is now explained in yet more detail with reference to FIGS. 8A to 8C.

In FIG. 8A, a curve 80 shows a profile of noise in a Hall voltage Vhall of the sensor 70 against the frequency, which is logarithmically plotted, without chopping and without the spinning current technique. At low frequencies, the flicker noise (1/f noise) dominates and is above a constant background of white noise which dominates at higher frequencies.

In FIG. 8B, a curve 81 shows the noise in the Hall voltage when using a spinning current technique and chopping. In this case, the flicker noise is shifted toward higher frequencies, namely mainly odd multiples of the chopper frequency fchop.

FIG. 8C shows the effects of the use of the digital low-pass filter 73 with a higher cut-off frequency at 83 and a lower cut-off frequency at 82. In both cases, the cut-off frequency is below the chopper frequency fchop, with the result that the peaks at the odd multiples of fchop and therefore the flicker noise are filtered out. With the lower cut-off frequency at 82, a large part of the remaining white noise is also filtered out, whereas, with the higher cut-off frequency at 83, the sensor signal can be followed more quickly. The sensor circuit in FIG. 7 can therefore be used to effectively suppress both flicker noise and white noise and also makes it possible to quickly react to changes in the measured magnetic field and therefore in the Hall voltage.

In other exemplary embodiments, a position or movement sensor which measures a relative position or movement of two elements with respect to one another is provided as a sensor. The terms "position sensor" and "movement sensor" are substantially interchangeable in this case since, if a movement is expressed by a speed for example, the position can be obtained by integrating the speed or the speed can be obtained as a derivative of the position with respect to time.

Figure 9:
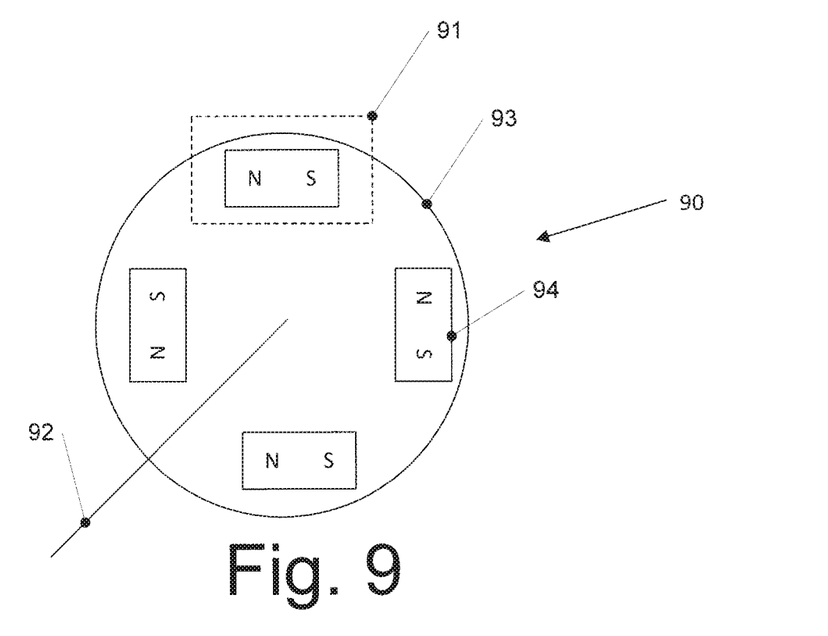
FIG. 9 shows an alternative sensor for the sensor circuit from FIG. 7.

FIG. 9 shows a movement sensor 90 which can be used instead of the sensor 70 in the sensor circuit in FIG. 7. The sensor 90 comprises a rotor 93 which can be rotated about an axis of rotation 92. Magnets 94 are arranged along the circumference of the rotor 93. Instead of a rotor, it is also possible to use a magnetic gearwheel. The sensor 90 also comprises a magnetic field sensor 91. The magnetic field sensor 91 may be configured like the sensor 70 in FIG. 7 or may be a different type of magnetic field sensor. When the rotor 93 rotates, the magnetic field sensor 91 captures a variable magnetic field, on the basis of which the angular velocity of the rotor 93 can be determined. The sensor 90 can therefore be used as an angular velocity sensor or angular position sensor.

In this case, an angle sensor for capturing a steeling wheel rotation may be involved, for example. The use of the digital low-pass filter 73 proves to be advantageous, in particular, for sensors in which the signal level is very low, on the one hand, and human feedback should be implemented quickly (as in the case of steering wheel control systems or other man-machine feedback systems, for example), on the other hand, and high demands are therefore imposed on a maximum permitted delay, since said low-pass filter can effectively suppress noise and, on the other hand, can follow a dynamic change in the signal.

Instead of the sensor 90, it is also possible to use a linear movement sensor. In this case, magnets, such as the magnets 94, are then arranged along a linearly movable element, the magnetic field of which is captured by a magnetic field sensor, such as the magnetic field sensor 91.

Figure 10:
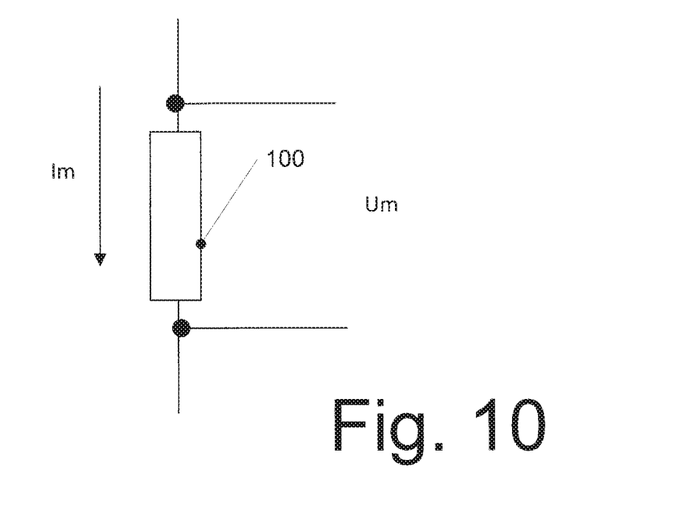
FIG. 10 shows a further alternative sensor for the sensor circuit from FIG. 7

Another example of a sensor which can be used in the sensor circuit in FIG. 7 is a current sensor. As an example, FIG. 10 shows a current sensor 100 which is in the form of a measuring resistor. A current Im to be measured causes a voltage drop Um across the measuring resistor, which voltage drop is then digitized by the analog/digital converter 72. In this case too, the use of the adjustable low-pass filter 73 enables good noise suppression in conjunction with a fast response behavior in the case of fast current changes.

Figure 11:
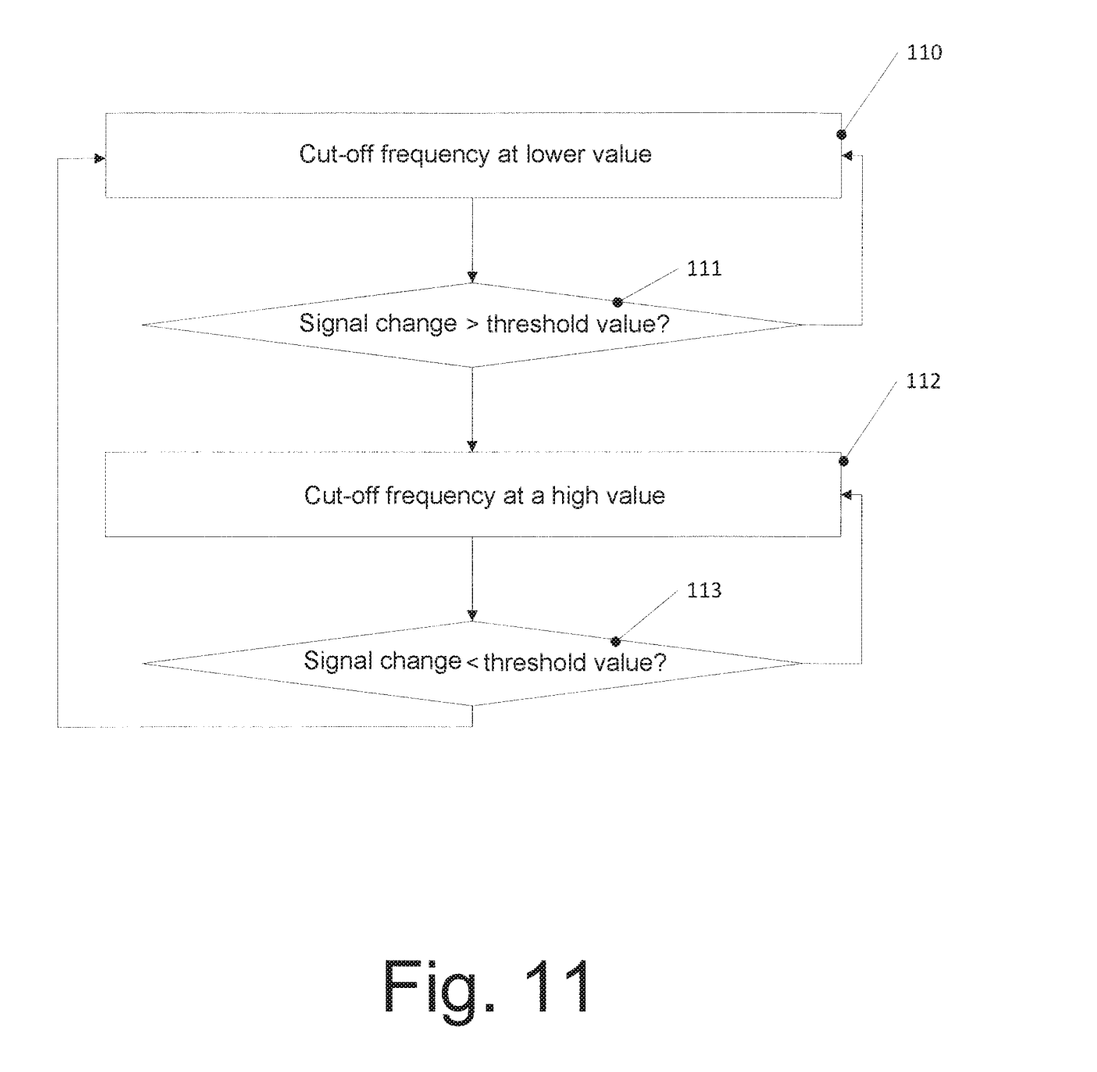
FIG. 11 shows a flowchart for illustrating methods according to some exemplary embodiments.

FIG. 11 shows a flowchart for illustrating a method for filtering a sensor signal according to one exemplary embodiment. In this case, the sensor signal may be generated by one of the sensors described with reference to FIGS. 7 to 10. Whereas the method in FIG. 11 is illustrated as a sequence of particular operations, the order of these operations should not be interpreted as restrictive. The method in FIG. 11 can be implemented by means of the filters described above and is described with reference to said filters in order to avoid repetitions. However, the method can also be implemented by means of other low-pass filters. In particular, a passband width of an adjustable low-pass filter or bandpass filter is adjusted using the method in FIG. 11, in this case, a cut-off frequency of a low-pass filter is adjusted as an example. This can be applied, in a corresponding manner, to adjustment of an upper cut-off frequency of a bandpass filter (and possibly corresponding adjustment of a lower cut-off frequency of the bandpass filter).

The method starts in step 110 with a cut-off frequency at a low value, for example in the region 23 in FIG. 2. However, the method can also start at a higher value.

At 111, a check is carried out in order to determine whether there is a signal change of a sensor signal which is greater than a threshold value, that is to say a measure of the signal change exceeds the threshold value. If this is not the case, the cut-off frequency remains at the low value at 110. Otherwise, the cut-off frequency is set to a higher value at 112.

At 113, a check is carried out in order to determine whether the signal change is now less than a threshold value. The threshold value at 113 may be the same as at 111 or may be less than that at 111, as already explained. If this is not the case, the cut-off frequency remains at a higher value at 112, and otherwise the method returns to 110, where the cut-off frequency is at the higher value.

In the example in FIG. 11, two different values are therefore used for the cut-off frequency, between which there is a changeover. As already explained, a plurality of different values can also be used. In the case of an implementation of a digital controller, such as the digital controllers 34 and 54 as state machines, 110 and 112 would correspond to states, whereas the decisions at 111 and 113 would correspond to transitions between these states.

It is therefore clear that the method in FIG. 11 should be understood merely as an example, and different variations and extensions, in particular to a plurality of values of cut-off frequencies, are possible.

Some exemplary embodiments are defined by the following examples:

Example 1. Sensor circuit having:
a spinning Hall circuit with a Hall sensor element for generating a spinning Hall sensor signal, and a filter comprising:
an input for receiving a signal based on the spinning Hall sensor signal,
an adjustable low-pass filter or adjustable bandpass filter with an adjustable passband width, and
a controller which is configured to adjust the passband width of the adjustable low-pass filter or bandpass filter on the basis of a comparison of a measure of a signal change of an input signal with a threshold value.

Example 2. Sensor circuit having:
a position sensor element and/or a movement sensor element for capturing a relative position or movement between a first element and a second element, and
a filter comprising:
an input for receiving a signal based on an output signal from the position sensor element and/or a movement sensor element,
an adjustable low-pass filter or adjustable bandpass filter with an adjustable passband width, and
a controller which is configured to adjust the passband width of the adjustable low-pass filter or bandpass filter on the basis of a comparison of a measure of a signal change of an input signal with a threshold value.

Example 3. Sensor circuit having:
a current sensor element, and
a filter comprising:
an input for receiving a signal based on an output signal from the current sensor element,
an adjustable low-pass filter or adjustable bandpass filter with an adjustable passband width, and
a controller which is configured to adjust the passband width of the adjustable low-pass filter or bandpass filter on the basis of a comparison of a measure of a signal change of an input signal with a threshold value.

Example 4. Sensor circuit according to one of examples 1 to 3, wherein the controller is configured to increase an upper cut-off frequency of the passband width or to keep it at a maximum value if the measure of the signal change exceeds the threshold value and to reduce the upper cut-off frequency or keep it at a minimum value if the measure of the signal change is below a further threshold value, wherein the further threshold value is less than or equal to the threshold value.

Example 5. Sensor circuit according to one of examples 1 to 4, wherein the filter is a digital filter.

Example 6. Sensor circuit according to one of examples 1 to 5, wherein the filter is configured in such a manner that, following a change to the passband width, a further change to the passband width can be carried out only after a predefined period of time.

Example 7. Sensor circuit according to one of examples 1 to 6, also comprising peak value detection which is configured to determine a peak value of noise of the input signal or of a signal derived from the input signal, wherein the digital low-pass filter is configured to determine the threshold value on the basis of the peak value.

Example 8. Sensor circuit according to example 7, wherein the filter is configured to determine the threshold value as the peak value of the noise in a state in which the cut-off frequency of the adjustable low-pass filter is at a minimum value.

Example 9. Sensor circuit according to one of examples 1 to 8,
wherein an input of the adjustable low-pass filter or bandpass filter is coupled to a signal input of the filter and an output of the adjustable low-pass filter or bandpass filter is coupled to an output of the filter, wherein the filter also comprises:
a comparator, wherein a first input of the comparator is coupled to the signal input and a second input of the comparator is coupled to the output of the adjustable low-pass filter or bandpass filter, wherein the digital comparator is configured to compare a difference between a signal value at the first input and a signal value at the second input with threshold value, and
wherein the controller is configured to adjust the passband width on the basis of an output signal from the digital comparator.

Example 10. Sensor circuit according to example 9, wherein the filter also comprises a register for storing the threshold value.

Example 11. Sensor circuit according to example 10, also comprising a high-pass filter and a peak detector, wherein an input of the high-pass filter is coupled to the signal input, an output of the high-pass filter is coupled to an input of the peak detector, and an output of the peak detector is coupled to the register for writing to the register.

Example 12. Sensor circuit according to example 11, wherein the high-pass filter has a cut-off frequency which corresponds to a minimum upper cut-off frequency of the passband width.

Example 13. Sensor circuit according to example 11 or 12, wherein the controller is configured to make it possible to write an output value from the peak detector to the register only when the upper cut-off frequency of the passband width is at a minimum value.

Example 14. Sensor circuit according to one of examples 9 to 13, also comprising a fixed low-pass filter with a fixed cut-off frequency, wherein an input of the fixed low-pass filter is coupled to the signal input and an output of the fixed low-pass filter is coupled to the input of the adjustable low-pass filter or bandpass filter and to the first input of the comparator.

Example 15. Sensor circuit according to example 14 and according to one of examples 11 to 13, wherein the output of the fixed low-pass filter is coupled to the input of the high-pass filter.

Example 16. Sensor circuit according to one of examples 1 to 15, wherein the controller comprises a state machine.

Example 17. Method for filtering a spinning Hall sensor signal, comprising:
adjusting a passband width of an adjustable low-pass filter or bandpass filter on the basis of a comparison of a measure of a signal change of a spinning Hall sensor signal with a threshold value, and
filtering the spinning Hall sensor signal using the adjustable low-pass filter or bandpass filter.

Example 18. Method according to example 17, also comprising:
increasing an upper cut-off frequency of the passband width or keeping the upper cut-off frequency at a maximum value if the measure of the signal change exceeds the threshold value, and
reducing the upper cut-off frequency or keeping the upper cut-off frequency at a minimum value if the measure of the signal change is below a further threshold value, wherein the further threshold value is less than or equal to the threshold value.

Example 19: Method according to example 17 or 18, also comprising:
determining a peak value of noise of the spinning Hall sensor signal or of a signal derived from the spinning Hall sensor signal, and
adjusting the threshold value on the basis of the peak value.

Example 20. Method according to example 19, wherein the adjustment of the threshold value comprises setting the threshold value as the peak value in a state in which an upper cut-off frequency of the passband width is at a minimum value.

Although specific exemplary embodiments have been described and illustrated in this description, persons with conventional expert knowledge will recognize that a multiplicity of alternative and/or equivalent implementations can be selected as a substitute for the specific exemplary embodiments which are shown and described in this description without departing from the scope of the invention shown. The intention is for this application to cover all adaptations or variations of the specific exemplary embodiments discussed here, Therefore, the intention is for this invention to be restricted only by the claims and the equivalents of the claims.

What is claimed is:
1. A sensor circuit, comprising:
a spinning Hall circuit comprising a Hall sensor element configured to generate a spinning Hall sensor signal; and
a filter comprising:
an input configured to receive an input signal based on the spinning Hall sensor signal,
an adjustable low-pass filter or adjustable bandpass filter with an adjustable passband width, and
a controller configured to adjust the adjustable passband width of the adjustable low-pass filter or the adjustable passband width of the adjustable bandpass filter based on a comparison of a measure of a signal change of the input signal with a threshold value, wherein the measure of the signal change of the input signal is a measured difference between successive samples of the input signal, and the controller is configured to adjust the adjustable passband width based on whether or not the measured difference exceeds the threshold value.

2. The sensor circuit of claim 1, wherein the input signal is representative of the spinning Hall sensor signal, and wherein the adjustable low-pass filter or adjustable bandpass filter is configured to filter at least one signal component of the input signal based on the adjustable passband width to output a filtered signal.

3. A sensor circuit, comprising:
   at least one of a position sensor element configured to capture a relative position between a first element and a second element or a movement sensor element configured to capture a relative movement between the first element and the second element; and
   a filter comprising:
      an input for receiving an input signal based on at least one sensor output signal from at least one of the position sensor element or the movement sensor element,
      an adjustable low-pass filter or adjustable bandpass filter with an adjustable passband width, and
      a controller configured to adjust the adjustable passband width of the adjustable low-pass filter or the adjustable passband width of the adjustable bandpass filter based on a comparison of a measure of a signal change of the input signal with a threshold value,
      wherein the measure of the signal change of the input signal is a measured difference between successive samples of the input signal, and the controller is configured to adjust the adjustable passband width based on whether or not the measured difference exceeds the threshold value.

4. The sensor circuit of claim 3, wherein the input signal is representative of the at least one sensor output signal, and wherein the adjustable low-pass filter or adjustable bandpass filter is configured to filter at least one signal component of the input signal based on the adjustable passband width to output a filtered signal.

5. A sensor circuit, comprising:
   a current sensor element; and
   a filter comprising:
      an input for receiving an input signal based on a sensor output signal from the current sensor element,
      an adjustable low-pass filter or adjustable bandpass filter with an adjustable passband width, and
      a controller configured to adjust the adjustable passband width of the adjustable low-pass filter or the adjustable passband width of the adjustable bandpass filter based on a comparison of a measure of a signal change of the input signal with a threshold value,
      wherein the measure of the signal change of the input signal is a measured difference between successive samples of the input signal, and the controller is configured to adjust the adjustable passband width based on whether or not the measured difference exceeds the threshold value.

6. The sensor circuit of claim 5, wherein the controller is configured to increase an upper cut-off frequency of the adjustable passband width or to maintain the adjustable passband width at a maximum value if the measure of the signal change exceeds the threshold value and to reduce the upper cut-off frequency or maintain the adjustable passband width at a minimum value if the measure of the signal change is below a further threshold value, wherein the further threshold value is less than or equal to the threshold value.

7. The sensor circuit claim 5, wherein the filter is a digital filter.

8. The sensor circuit of claim 5, wherein the filter is configured in such a manner that, following a first change to the adjustable passband width, a second change to the adjustable passband width is enabled only after a predefined period of time following the first change.

9. The sensor circuit of claim 5, further comprising:
   a peak value detector configured to determine a peak value of noise of the input signal or of a signal derived from the input signal,
   wherein the filter is configured to determine the threshold value based on the determined peak value.

10. The sensor circuit of claim 9, wherein the filter is configured to determine the threshold value as the determined peak value in a state in which a cut-off frequency of the adjustable low-pass filter is at a minimum value.

11. The sensor circuit of claim 5, wherein the controller comprises a state machine.

12. The sensor circuit of claim 5, wherein the input signal is representative of the sensor output signal, and wherein the adjustable low-pass filter or adjustable bandpass filter is configured to filter at least one signal component of the input signal based on the adjustable passband width to output a filtered signal.

13. A sensor circuit, comprising:
   a sensor configured to generate a sensor output signal;
   a filter comprising:
      a signal input configured to receive an input signal based on the sensor output signal;
      an adjustable low-pass filter or adjustable bandpass filter with an adjustable passband width; and
      a controller configured to adjust the adjustable passband width of the adjustable low-pass filter or the adjustable passband width of the adjustable bandpass filter based on a comparison of a measure of a signal change of the input signal with a threshold value,
   wherein an input of the adjustable low-pass filter or an input of the adjustable bandpass filter is coupled to the signal input of the filter,
   wherein an output of the adjustable low-pass filter or an output of the adjustable bandpass filter is coupled to an output of the filter,
   wherein the filter further comprises a comparator, wherein a first input of the comparator is coupled to the signal input and a second input of the comparator is coupled to the output of the adjustable low-pass filter or to the output of the adjustable bandpass filter, wherein the comparator is configured to compare a difference between a signal value at the first input and a signal value at the second input with the threshold value, and
   wherein the controller is configured to adjust the adjustable passband width based on a comparator output signal from the comparator that indicates a comparison result.

14. The sensor circuit of claim 13, wherein the filter further comprises a register for storing the threshold value.

15. The sensor circuit of claim 14, further comprising:
   a high-pass filter; and
   a peak detector,
   wherein an input of the high-pass filter is coupled to the signal input of the filter, an output of the high-pass filter is coupled to an input of the peak detector, and an output of the peak detector is coupled to the register for writing to the register.

16. The sensor circuit of claim 15, wherein the high-pass filter has a cut-off frequency which corresponds to a minimum upper cut-off frequency of the adjustable passband width.

17. The sensor circuit of claim 15, wherein the controller is configured to enable writing an output value from the peak detector to the register only when a cut-off frequency of the adjustable passband width is at a minimum value.

18. The sensor circuit of claim 15, further comprising:
a fixed low-pass filter with a fixed cut-off frequency, wherein an input of the fixed low-pass filter is coupled to the signal input and an output of the fixed low-pass filter is coupled to the input of the adjustable low-pass filter or the input of the adjustable bandpass filter and to the first input of the comparator.

19. The sensor circuit of claim 18, wherein the output of the fixed low-pass filter is coupled to the input of the high-pass filter.

20. The sensor circuit of claim 15, wherein the peak detector is configured to determine a peak value of noise and adjust the threshold value stored in the register based on the determined peak value.

21. A method for filtering a sensor signal, the method comprising:
adjusting a passband width of an adjustable low-pass filter or an adjustable bandpass filter based on a comparison of a measure of a signal change of a sensor signal with a threshold value;
increasing an upper cut-off frequency of the adjustable passband width or maintaining the upper cut-off frequency at a maximum value if the measure of the signal change exceeds the threshold value, and
reducing the upper cut-off frequency or maintaining the upper cut-off frequency at a minimum value if the measure of the signal change is below a further threshold value, wherein the further threshold value is less than or equal to the threshold value; and
filtering the sensor signal using the adjustable low-pass filter or the adjustable bandpass filter.

22. The method of claim 21, further comprising:
increasing an upper cut-off frequency of the adjustable passband width or maintaining the upper cut-off frequency at a maximum value if the measure of the signal change exceeds the threshold value, and
reducing the upper cut-off frequency or maintaining the upper cut-off frequency at a minimum value if the measure of the signal change is below a further threshold value, wherein the further threshold value is less than or equal to the threshold value.

23. The method of claim 21, further comprising:
determining a peak value of noise of the sensor signal or of a signal derived from the sensor signal, and
adjusting the threshold value on the basis of the determined peak value.

24. The method of claim 23, wherein the adjustment of the threshold value comprises setting the threshold value as the determined peak value in a state in which the upper cut-off frequency of the adjustable passband width is at a minimum value.

25. The method of claim 21, wherein the adjustable low-pass filter or adjustable bandpass filter is configured to filter at least one signal component of the sensor signal based on the adjustable passband width to output a filtered signal.

* * * * *